US012699127B1

(12) United States Patent
Tsironis

(10) Patent No.: US 12,699,127 B1
(45) Date of Patent: Aug. 4, 2026

(54) MIXED MODE HYBRID HARMONIC LOAD PULL SYSTEM

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 152 days.

(21) Appl. No.: 18/897,555

(22) Filed: Sep. 26, 2024

(51) Int. Cl.
| | |
|---|---|
| *G01R 31/28* | (2006.01) |
| *G01R 1/067* | (2006.01) |
| *G01R 27/32* | (2006.01) |
| *H01P 5/04* | (2006.01) |
| *H03H 7/38* | (2006.01) |

(52) U.S. Cl.
CPC ..... *G01R 31/2822* (2013.01); *G01R 1/06772* (2013.01); *G01R 27/32* (2013.01); *H01P 5/04* (2013.01); *H03H 7/38* (2013.01)

(58) Field of Classification Search
CPC .......... G01R 31/2822; G01R 1/06772; G01R 27/32; H01P 5/04; H03H 7/38
See application file for complete search history.

(56) References Cited

U.S. PATENT DOCUMENTS

| | | | |
|---|---|---|---|
| 6,509,743 | B1 | 1/2003 | Ferrero |
| 6,639,393 | B2 | 10/2003 | Tasker |
| 6,674,293 | B1 | 1/2004 | Tsironis |
| 6,812,714 | B2 | 11/2004 | Verspecht |
| 8,497,689 | B1 | 7/2013 | Tsironis |
| 9,857,410 | B1 * | 1/2018 | Tsironis ............. G01R 31/2621 |
| 10,444,266 | B1 * | 10/2019 | Tsironis ............. G01R 31/2822 |
| 11,041,882 | B1 * | 6/2021 | Tsironis ................. G01R 1/073 |
| 2020/0103447 | A1 * | 4/2020 | Esposito .......... G01R 31/31937 |
| 2025/0389765 | A1 * | 12/2025 | Sheikh ............... G01R 31/2822 |

OTHER PUBLICATIONS

Load Pull [online] Wikipedia [Retrieved on Nov. 20, 2021]. Retrieved from Internet <URL: http://en.wikipedia.org/wiki/Load_pull>.
"Computer controlled microwave tuner CCMT", Product Note 41, Focus Microwaves, Jan. 1998.
5242A PNAx Microwave Network Analyzer, 26.5GHZ [online] Keysight [Retrieved on Sep. 17, 2024]. Retrieved from Internet <URL: http://www.keysight.com/en/pd-867173-pn-N5242A/pna-x-microwave-network-analyzer?nid=-536902643.426031.00&cc=CA &Ic=eng>.
R&S ZVA vector network analyzer [online], Rohde & Schwarz [Retrieved on Sep. 17, 2024]. Retrieved from Internet <URL: http://www.rohde-schwarz.com/en/product/zva-productstartpage_ 63493-9660.html>.
"MPT, a universal Multi-Purpose Tuner", product note 79, Focus Microwaves Inc., Oct. 2004.

* cited by examiner

*Primary Examiner* — Alvaro E Fortich

(57) ABSTRACT

A hybrid multi-harmonic load pull tuner is composed of a main frame and a harmonic extension module. The main frame includes two independently controlled synchronized signal sources, one injecting power into the input of a DUT (transistor) and the other injecting power via a power amplifier into the output of the DUT. The harmonic extension module pre-matches the amplifier to the DUT at a fundamental frequency and creates arbitrary user defined impedances at two harmonic frequencies. The quasi open-loop hybrid configuration ensures conjugate matching of transistors with very low output impedance using low injected power under stable (non-spurious) operation conditions.

6 Claims, 9 Drawing Sheets

Tuning range reduction
due to insertion loss (10)
or (12) in Figure 1

32

33

31

30

Tuning range at Tuner
port

Effective Tuning
range at DUT port

FIG. 3: Prior art

FIRST CARRIAGE

SECOND CARRIAGE

THIRD CARRIAGE

FIRST CARRIAGE

SECOND CARRIAGE

THIRD CARRIAGE

OVERALL FUNDAMENTAL BAND

[52]+[53]

SLUGS IN CARRIAGES 2 & 3

[51]

SLUG IN CARRIAGE 1

OVERALL FUNDAMENTAL BAND

[58]+[501]    #3,#5    #4,#6    [57]+[59]    [56]    #1    #2    [55]

SLUGS #i IN CARRIAGES 2 & 3      SLUGS #i IN CARRIAGE 1

1

MIXED MODE HYBRID HARMONIC LOAD PULL SYSTEM

CROSS-REFERENCE TO RELATED ARTICLES

1. Load Pull [online] Wikipedia [Retrieved on 2021 Nov. 20]. Retrieved from Internet <URL: http://en.wikipedia.org/wiki/Load_pull>.
2. "Computer Controlled Microwave Tuner-CCMT", Product Note 41, January 1998, Focus Microwaves.
3. U.S. Pat. No. 8,497,689, Christos Tsironis: Method for reducing power requirements in active load pull system.
4. U.S. Pat. No. 6,509,743, Andrea Ferrero: Active load or source impedance synthesis apparatus for measurement test set of microwave components and systems.
5. 5242A PNAx Microwave Network Analyzer, 26.5 GHz [online] Keysight [Retrieved on 2024 Sep. 17]. Retrieved from Internet <URL: http://www.keysight.com/en/pd-867173-pn-N5242A/pna-x-microwave-network-analyzer?nid=-536902643.426031.00&cc=CA&lc-eng>.
6. R&S ZVA vector network analyzer [online], Rohde & Schwarz [Retrieved on 2024 Sep. 17]. Retrieved from Internet <URL: http://www.rohde-schwarz.com/en/product/zva-productstartpage_63493-9660.html>.
7. U.S. Pat. No. 6,639,393, Paul Juan Tasker: Methods and apparatus for time-domain measurement with a high frequency circuit analyzer.
8. U.S. Pat. No. 6,812,714, Jan Verspecht: Apparatus for collecting signal measurement data at signal ports of an RF and microwave device-under-test, under different impedance load conditions.
9. "MPT, a universal Multi-Purpose Tuner", product note 79, Focus Microwaves Inc., October 2004.
10. U.S. Pat. No. 6,674,293, Christos Tsironis: Adaptable pre-matched tuner system and method.

PRIORITY CLAIM

Not applicable

BACKGROUND OF THE INVENTION

This invention relates to testing and characterization of microwave high power transistors and amplifier chips (device under test, DUT); the test system disclosed here allows for high speed non-linear production testing chips on wafer through acquisition and processing of their RF characteristics, typically gain, output power, efficiency, inter-modulation etc., under precise load impedance conditions at the fundamental and harmonic frequencies (see ref. 1) corresponding to meaningful reflection factors $|\Gamma_{LOAD}| \leq 1$ in order to design appropriate matching networks and integrate the chips into RF amplifier modules.

DESCRIPTION OF PRIOR ART

Traditional passive load pull systems (FIG. 1) comprise a signal source 1, which typically also includes a driver amplifier, an input impedance tuner 2 a DUT (Device Under Test) in a test fixture 3, an output impedance tuner 4 and a microwave power sensor 5. The injected power is measured through a coupler (see ref. 8) at a coupled port 6 at the input and the output power at the power meter (sensor) 5. Additional components, such as bias tees, attenuators, filters and couplers, as well as instruments such as power supplies and spectrum analyzers are also used but employ the same basic concept. The DUT's characteristics are measured as a function of source and load impedances generated by the tuners 2 and 4 at the operating (fundamental, Fo) and a number of harmonic frequencies (2Fo, 3Fo . . . ). The total is controlled by a system computer 11, which controls the tuners 2, 4 using digital cables 7, 8 and communicates 9, 13 with the instruments 5 for configuring, triggering and data acquisition (see ref. 1).

The reflection factors 20 created by the impedance tuners cover, typically, the largest part of the reflection factor plan (Smith chart), 21, FIG. 2; appropriate tuning and interpolation algorithms (see ref. 2) allow synthesizing almost every impedance within the effective tuning range 32 at the DUT port (FIG. 3); the effective tuning range at the DUT ports is reduced, compared with the "tuning range at tuner port" 33 because of the insertion loss between DUT and tuner (segments 10 and 12 in FIG. 1); therefore the actual tuning capacity of such a "passive" tuner system is shown in FIG. 3 as "tuning range at DUT port" 32. However, many power transistors (DUT) need to be matched at impedances Z (or reflection factors Γ) shown as dots 30 or 31; the equivocal relationship between impedance Z, characteristic impedance Zo and Reflection Factor Γ is: Γ=(Z−Zo)/(Z+Zo); whereby Zo=50Ω, typically.

In the first case a minimization of the test fixture and interconnection loss (10, 12) might allow the tuner to reach this point 30. But in many other cases, like in the case of dot 31, this is simply impossible using a passive system as shown in FIG. 1. In this case an "active" solution is necessary. This is shown in FIG. 4; in this case, on top of the input signal 41 an additional signal 42, coherent with the input signal 41 transmitted through the DUT to its output port (Pdut), is injected (Pinj) into the DUT output port and its phase and amplitude are adjusted in order to be properly superimposed to the signal Pext which is reflected by the harmonic extender 47 and generate an enhanced virtual load, which corresponds to a reflection factor larger than the reflection factor generated by the power (Pext) alone (see ref. 3, 6). These configurations are called "open loop" because they use two independently controllable signal sources, one at the input and one at the output of the DUT. However, the configuration is not truly "open loop", because the two sources are not really independent, since they are phase synchronized (coherent) via the low frequency synchro-trigger signal 40.

Hitherto open-loop active injection load pull systems (see ref. 4) employ a harmonic receiver (network analyzer, VNA, see ref. 5), 43 which has at least two coherent (or synchronized) internal signal sources 1 and 2, which generate a signal at a frequency (Fo) also called "fundamental" frequency of which the relative amplitude and phase can be controlled and adjusted by the operator using a system controller and appropriate commands.

BRIEF DESCRIPTION OF THE DRAWINGS

The invention will be better understood through the Figures included as follows:

FIG. 5A depicts a single slug per carriage; FIG. 5B depicts double slug carriages for higher bandwidth.

FIG. 6A depicts frequency coverage of single slug embodiment (FIG. 5A); FIG. 6B depicts frequency coverage of dual slug embodiment (FIG. 5B).

DETAILED DESCRIPTION OF THE INVENTION

Figure 1:
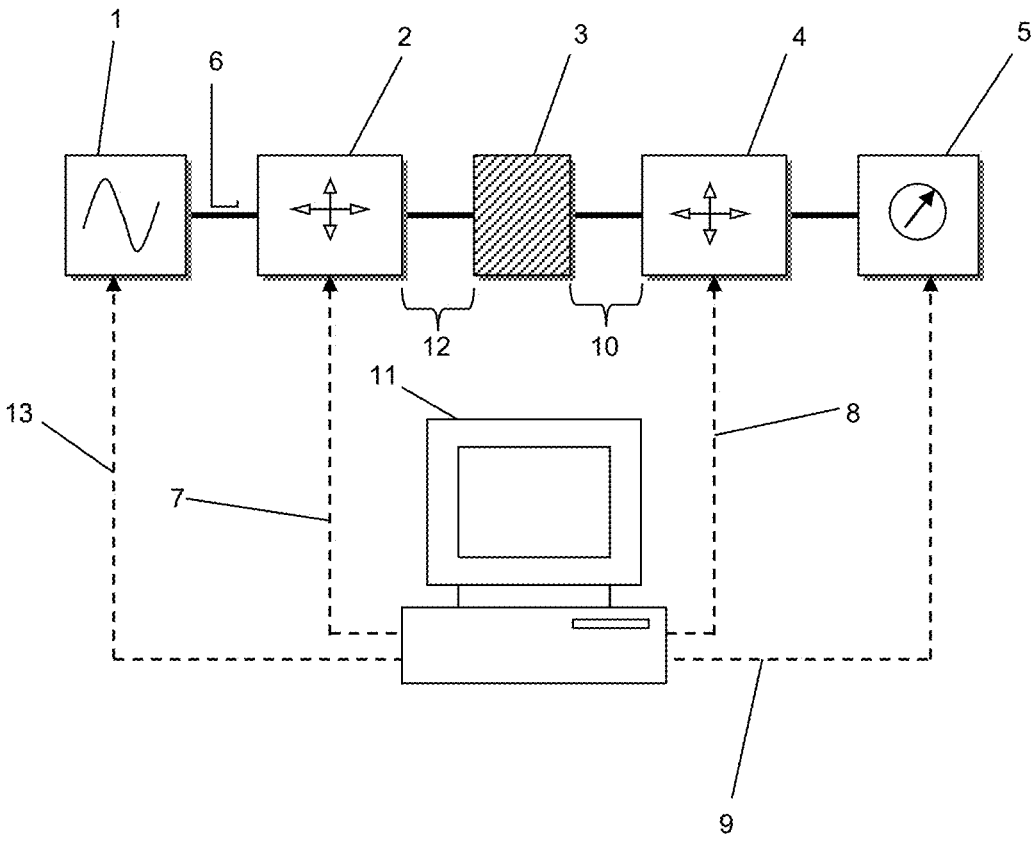
FIG. 1 depicts prior art, a typical automated load pull test setup using passive impedance tuners only.
Figure 2:
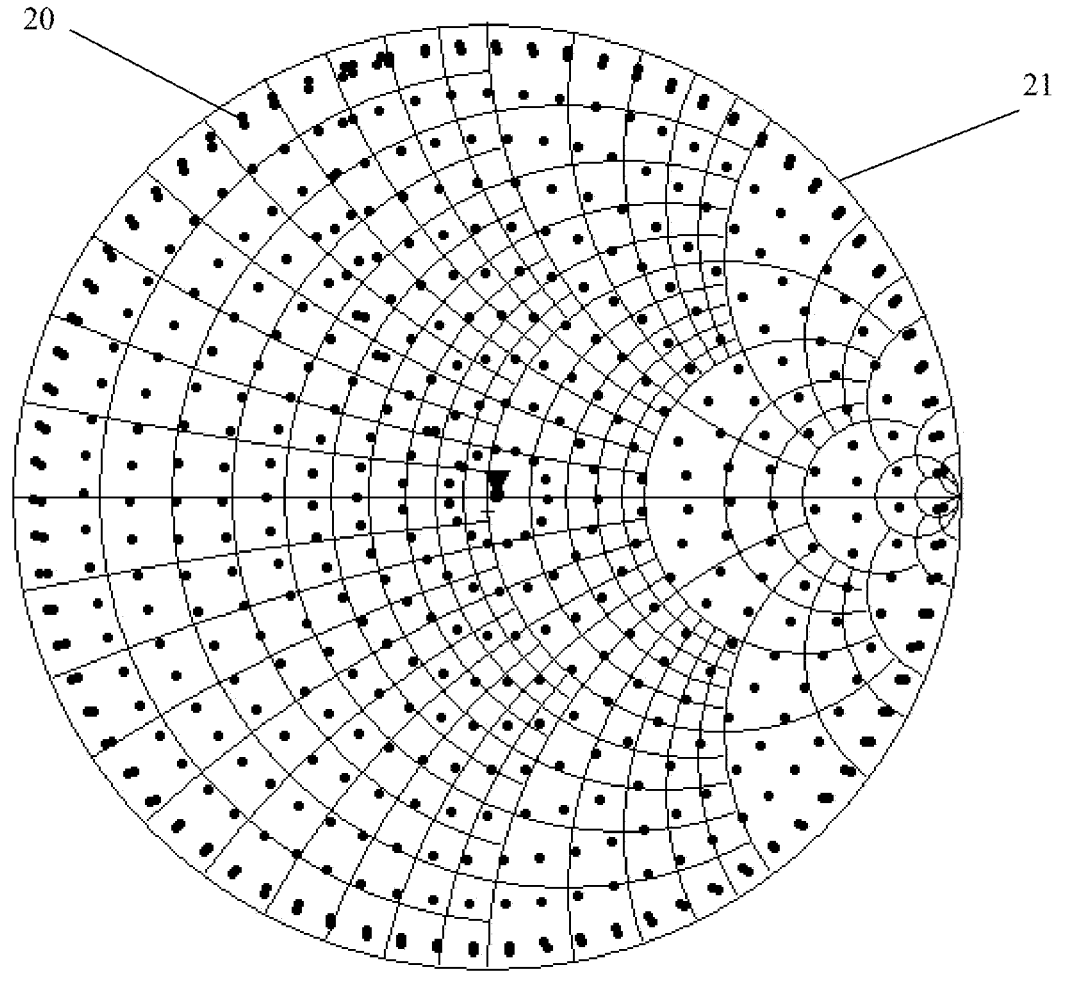
FIG. 2 depicts prior art, the distribution of calibration points of passive slide screw tuners on the reflection factor diagram (Smith chart).
Figure 3:
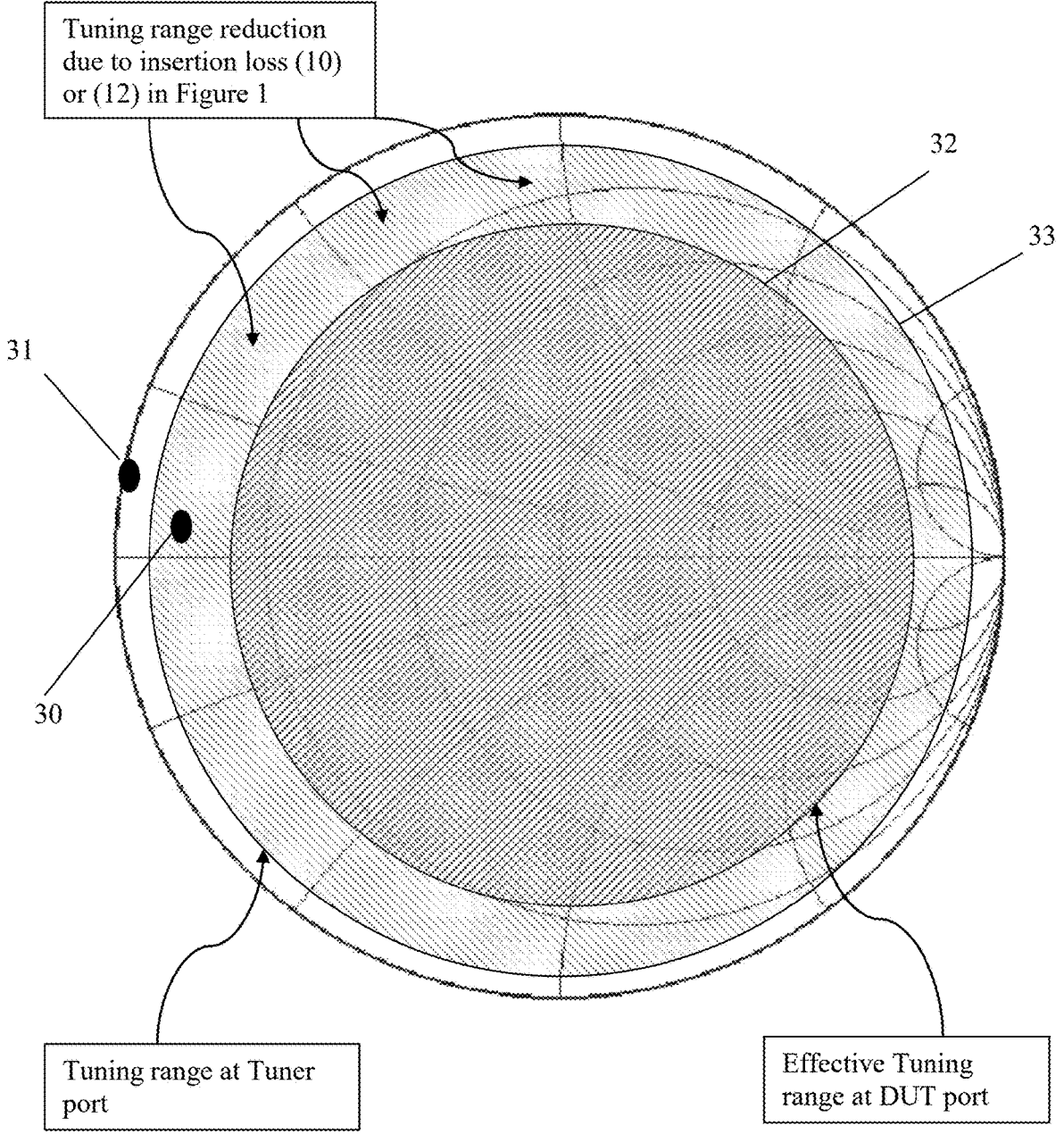
FIG. 3 depicts prior art, the reduction of tuning range (dynamics) of passive impedance tuners due to insertion loss between the tuner and the DUT.
Figure 4:
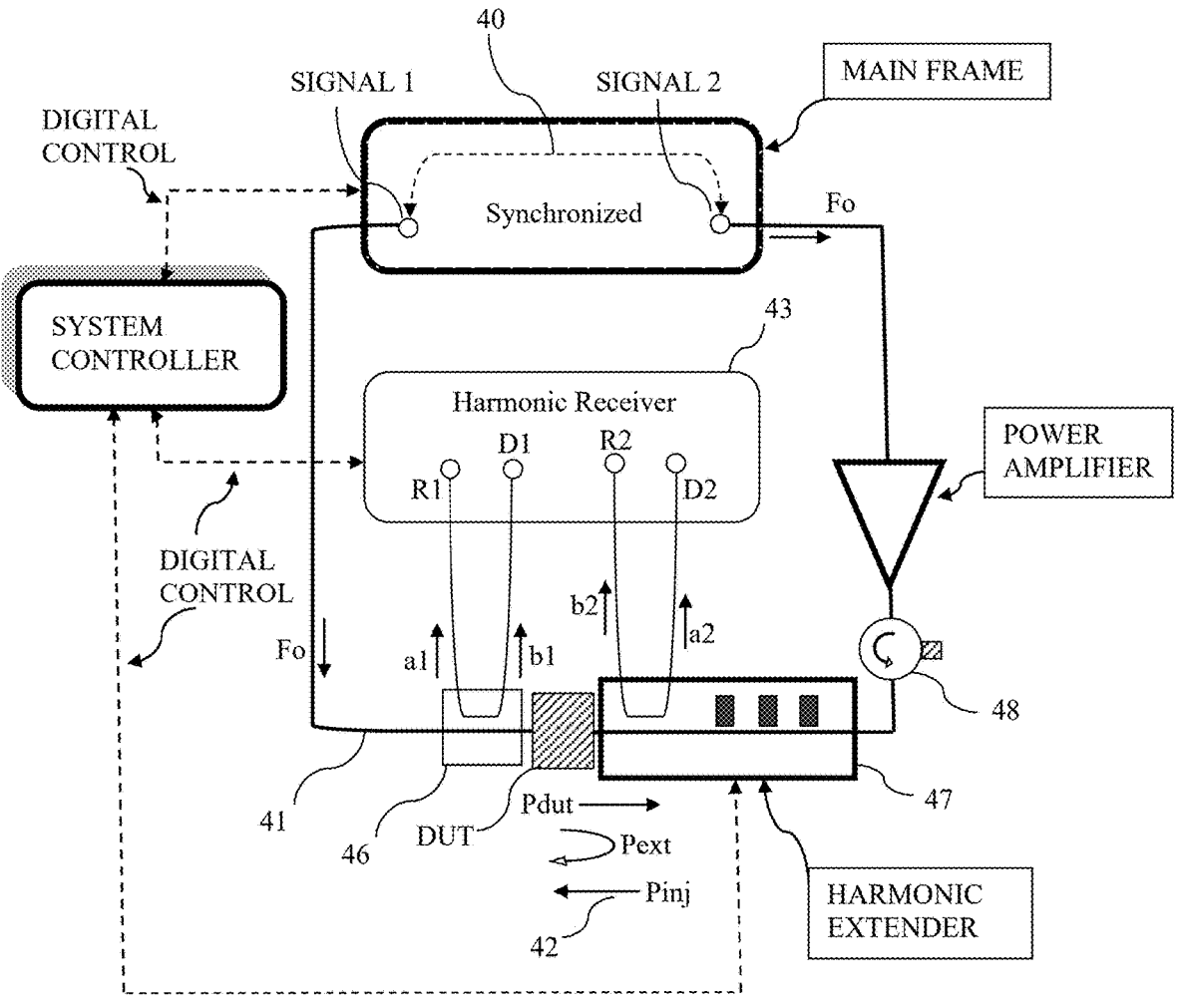
FIG. 4 depicts a schematic structure of the hybrid open loop active injection load pull tuner and the associated nomenclature. This tuner allows active injection at the fundamental frequency (Fo) and independent active or passive harmonic tuning using the harmonic extender.
Figure 9:
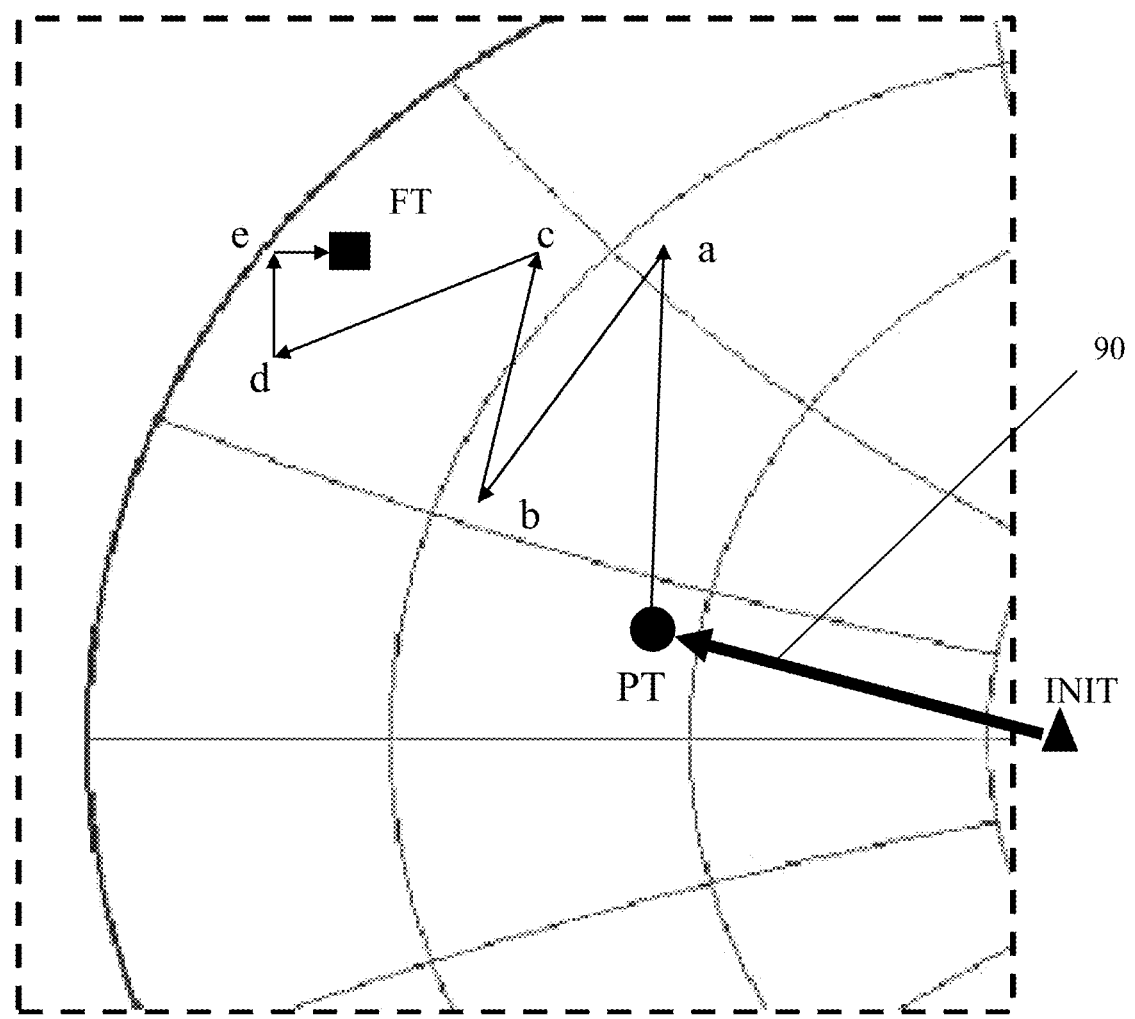
FIG. 9 depicts the iterative fundamental hybrid impedance creation trajectory starting at a fixed pre-matching point PT followed by corrective steps (a to e) towards the target FT.

The embodiment of the open-loop active injection load pull system of FIG. 4 employs a main frame and a separate harmonic receiver 43. The main frame includes two synchronized signal sources 1 and 2, which generate a signal at a fundamental frequency (Fo) frequency of which the relative amplitude and phase can be controlled and adjusted by the operator using the system controller. Their relative phase and amplitude remain constant during a power reading at the harmonic receiver detectors D1 and D2 (see ref. 5, 6). In a different embodiment, combined harmonic receivers/analyzers may have more than two internal signal sources which can be adjusted to generate also harmonic coherent signals (see ref. 5, 6). The main signal 41 at F=Fo is injected into the input port of the DUT, traverses low loss directional couplers 46 and the DUT and is processed by the harmonic extender; the coupled ports of the couplers are connected to a reference R1 and a measurement D1 detectors of the harmonic receiver and allow to measure the travelling waves a1 and b1 (see ref. 7) and thus the injected power into the DUT and its internal input impedance. The injected power at the DUT input port is defined as $Pin=|a1|^2$ (eq. 1) and the input impedance (reflection factor Γdut) as: $Γdut=b1/a1$ (eq. 2). The power delivered from the output of the DUT to the load is defined as $Pdut=|b2|^2$ (eq. 3) and the total reflection factor seen by the DUT at its output port is $Γload=a2/b2$ (eq. 4). In fact, the total power injected into the output port of the DUT from the load is: $Ptotal=Pext+Pinj$ (eq. 5), whereby Pext is the power generated by the harmonic extender. The output of the power amplifier is protected using an isolator 48. Since Pinj can be adjusted in amplitude and phase a condition can be reached, whereby the reflected power Ptotal is equal to or higher than the power generated by the DUT, thus resulting in a total reflection factor Gamma (Γ) which can reach 1 (|Γtotal|≤1) or be even higher than 1 (|Γtotal|>1) (eq. 6); this is the purpose of the active injection tuning. The purpose of the test setup discussed here is to be wafer based: i.e. the DUT are chip transistors or monolithic integrated circuit (MMIC) amplifiers manufactured on a semiconductor wafer and shall be individually load-pull tested in-situ, i.e. before they are sectioned, separated and individually packaged. The chip-devices are designed and supposed to be identical, which in praxis means that they largely have very similar or identical DC and RF behavior, meaning that the passive tuning point PT (FIG. 9) will remain fixed during the scanning of the semiconductor wafer.

The hybrid setup used is shown in FIG. 4 (see ref. 3). It includes the wideband harmonic receiver, having a signal output at the fundamental (operating) frequency Fo followed (optionally) by a booster amplifier enhancing the driving the signal 41. The amplified signal enters into the input low loss coupler 46 and then into the DUT. The signal exits the DUT at its output port; a small portion of the injected and extracted signal is sampled by the coupled branches of the couplers 46 and injected into the test ports of the receiver 43, whereby the R detectors serve as reference and the D detectors as measurement sensors of the associated injected and reflected traveling power waves a1, a2 and b1, b2, whereby a1 and a2 propagate towards the DUT and b1 and b2 propagate away from the DUT.

Figure 5A:
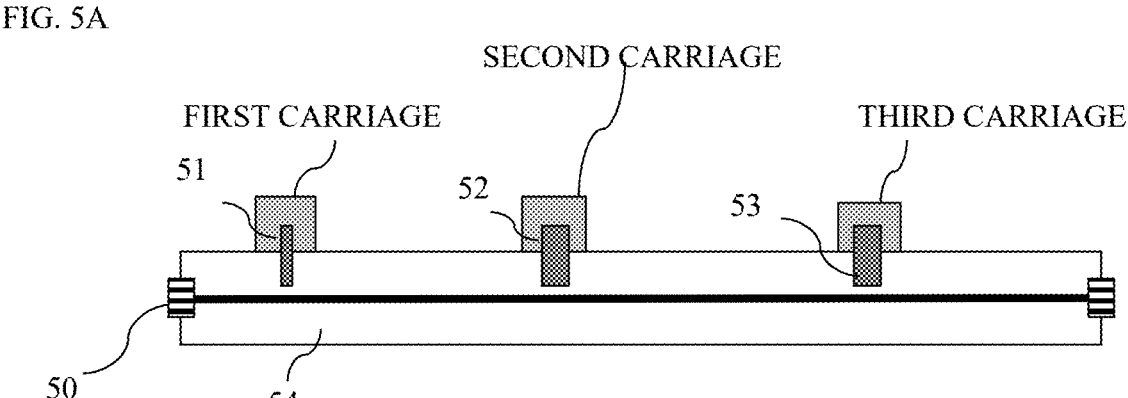
FIGS. 5A through 5B depicts embodiments of harmonic extenders.
Figure 5B:
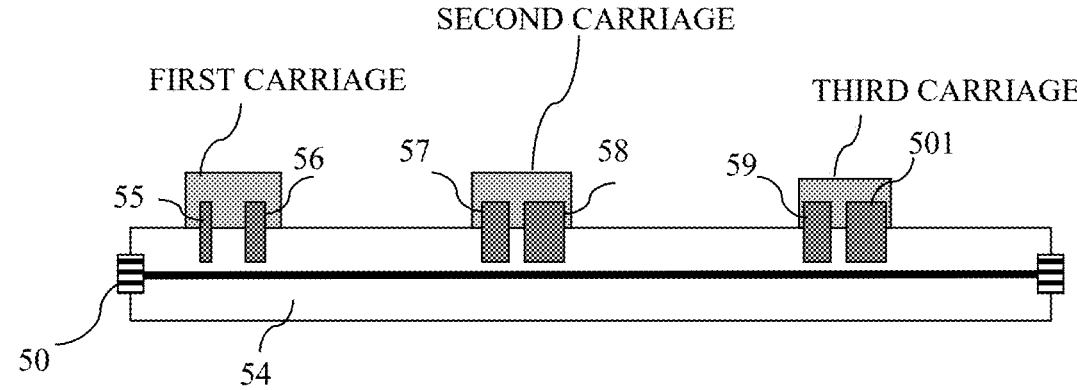
Figure 6A:
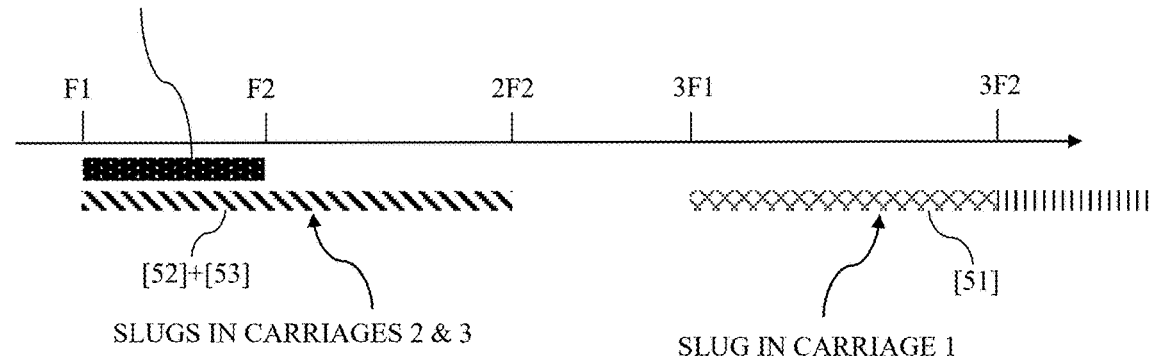
FIGS. 6A through 6B depicts frequency bands covered by the embodiments of FIGS. 5A and 5B.
Figure 6B:
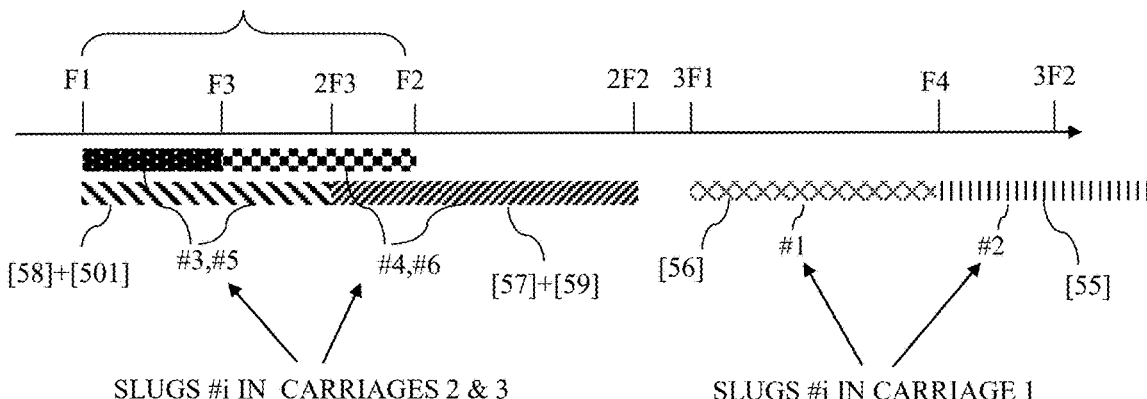
Figure 8:
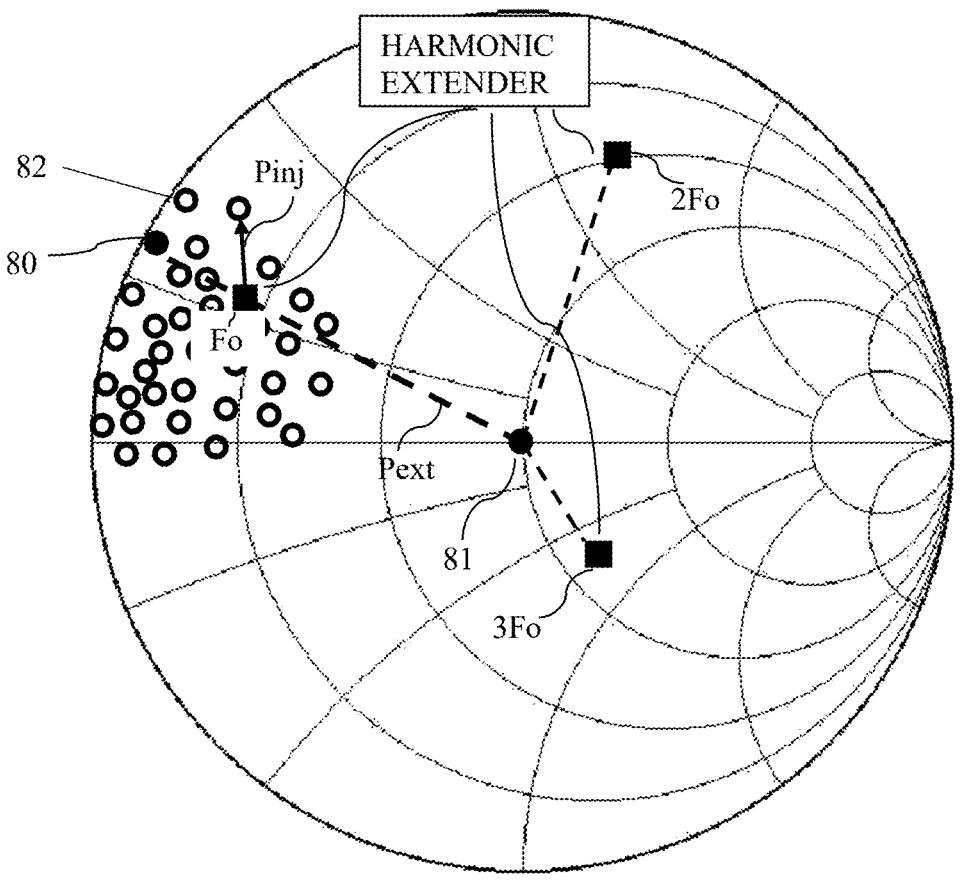
FIG. 8 depicts the hybrid and harmonic impedance synthesis mechanism on the Smith chart at the DUT reference plan.

FIG. 5 depicts the harmonic tuning core of the mixed mode harmonic extender 47: the device operates in "mixed mode" because, other than in prior art harmonic tuning, where all broadband tuning probes cover all three harmonic frequencies, in the present embodiment only two tuning probes cover the fundamental Fo frequency and the second harmonic 2Fo (see ref. 10), whereas a third tuning probe covers only the third harmonic 3Fo, which enhances the bandwidth and manufacturability of the tuner; in its simplest form the harmonic extender includes a low loss bi-directional signal coupler (FIG. 4, see ref. 8) sampling forward b2 and reverse a2 propagating signal power from the main transmission line and feeding them into the test ports R2 and D2 of the harmonic receiver 43. The harmonic extender 47 does more: a) it detects the travelling waves b2 and a2 and allows the hybrid tuning iterations (FIG. 9); b) it prematches the very low output impedance of the DUT (typically 0.5 to 252) to the 5052 output impedance of the power amplifier and the attached isolator 48 in the active injection loop (see ref. 3), and c) it controls, simultaneously, the harmonic impedances at 2Fo and 3Fo presented to the DUT (FIG. 8); FIG. 5 shows two embodiments: they are identical in function but the use of two slugs per carriage in FIG. 5B allows higher instantaneous bandwidth than the embodiment using single slugs in FIG. 5A. The slugs have different lengths along the slotted airline (slabline): short slugs 51, 55, 56, when fully inserted in the slabline 54, create reflection (cover) higher frequencies; long slugs 52, 53, 57, 58, 59, 501 cover lower frequencies. In all cases the short slugs reflect only the third harmonic frequency 3Fo and the long slugs reflect the fundamental Fo and the second 2Fo harmonic frequency. The mechanism of tuning at Fo and 2Fo is disclosed in prior art (see ref. 9; new here is that the third harmonic frequency is not tuned to using the method of ref. 9, instead it is tuned to using the method of single probe tuners (ref. 2), which is possible due to the band separation between Fo-2Fo and 3Fo; this is shown also in FIG. 6.

Figure 7:
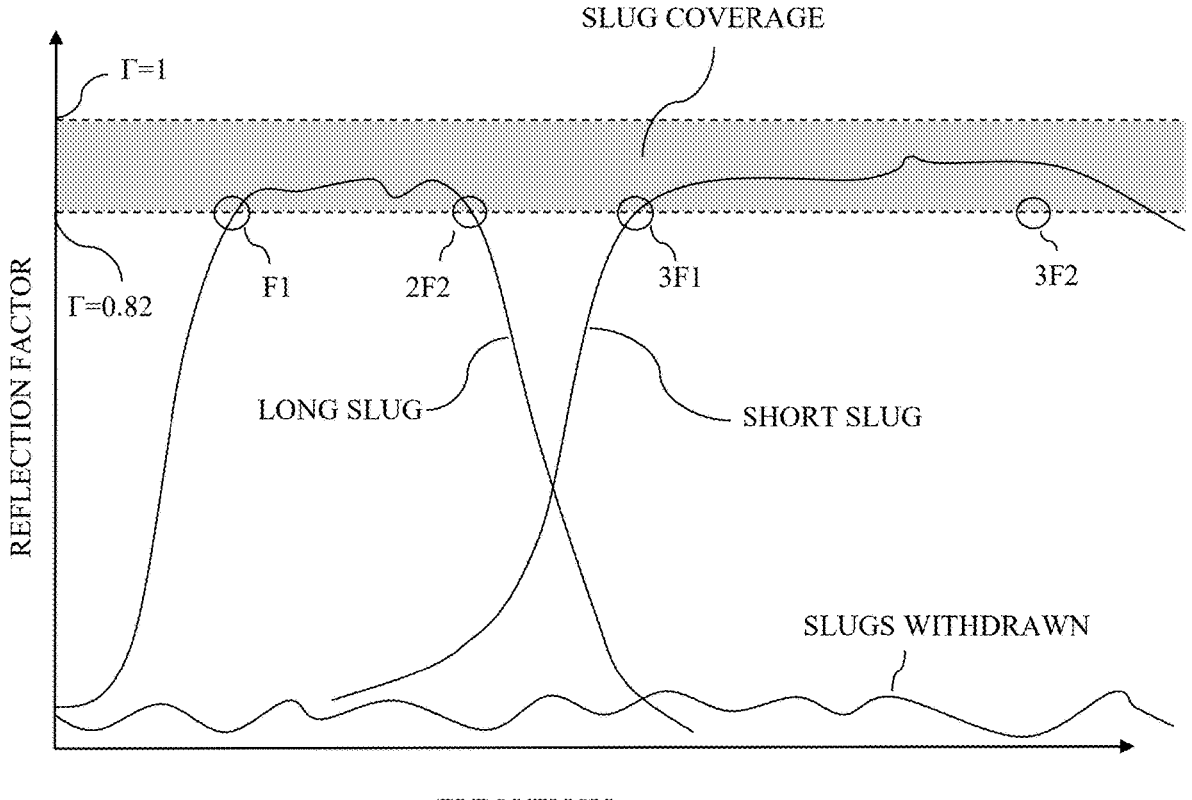
FIG. 7 depicts typical frequency response (coverage) of two types of tuning probe (slug): a short (high frequency) and a long (low frequency) slug, in two settings: full insertion into the slot of the airline slot and full withdrawal (airline characteristic impedance is 50 Ohm), including the corner frequencies of operation, as per FIG. 6.

The single slug embodiment of FIG. 5A controls a fundamental frequency band from F=F1 to F=F2 using slugs 52 and 53 (FIG. 5A, 6A); this means the slugs 52 and 53 placed away from the test port 50 must both cover the frequency range from F1 to 2F2. Slug 51 placed closest to the test port 50, then covers the frequency range from 3F1 to 3F2 and, possibly but not necessarily, beyond. This can be visualized in FIG. 7: frequency coverage is defined by the crossing of the maximum reflection trace (slug inserted to maximum depth) with the VSWR=10:1 (or |T|=0.82) line. The slugs all behave the same way, because they are by nature non-resonant. The dual slug embodiment of FIG. 6B uses pairs of slugs to cover a contiguous bandwidth; in this case the low frequency pair of slugs covers frequencies from F1 to F3 and from F3 to F2, increasing this way the instantaneous bandwidth; or slugs 58-501 and 57-59 cover from F1 to 2F2 and slugs 55-56 cover frequencies from 3F1 to 3F2 (crossing at a frequency F4) and beyond. If the selected slugs cover overlapping frequency bands, for instance, if 2F2>3F1, this will not conflict, because the slugs are all calibrated at all frequencies, and the tuning procedure is affected mostly by the predominant slugs.

FIG. 8 shows the impedance synthesis mechanism: starting with 50Ω item 81 in order to reach point 80 at the fundamental frequency Fo, the reflection factor vector includes two arrows: the first is created by passive reflection Pext generated by the harmonic extender reaching the point marked Fo. From there, to reach point 80 the active injection Pinj adds a smaller vector, one of the points like 82 that can be adjusted in size by increasing the signal 2 amplitude and rotated by controlling its phase; this correction process is visualized in FIG. 9, where from the point PT (corresponding to Fo in FIG. 8), created by the vector 90, a number of step a, b, c . . . lead to the target FT; each time the active signal is modified, the signal waves b2 and a2 are measured via the signal coupler of the harmonic extender and corrected. The closer PT is to FT, the faster the convergence of the system; to be noted that this step search is very fast, since the move from PT to FT involves only electronic and no mechanical control, like the move from the probe withdrawal state INIT to PT.

This invention discloses preferred embodiments of a new hybrid harmonic load pull system, which allows production quantity electronic high-speed load pull testing while controlling the maximum tuned reflection factor within physically and economically meaningful power amplifiers and operationally safe limits. Obvious alternative embodiments are imaginable but shall not impede the originality of the described preferred embodiments.

What is claimed is:

1. A hybrid load pull test system comprising:
a main frame and a harmonic extension module,
wherein,
    the main frame comprises two remotely controlled synchronized signal sources generating RF signal at a frequency Fo, a first signal source and a second signal source, and at least one power amplifier having an input port connected to the second signal source and an output port;
and wherein,
    the harmonic extension module comprises a test and an idle port linked using a low loss transmission airline with an axial slot (slabline), a bi-directional signal coupler having an input, an output, a coupled and an isolated port, three remotely controlled carriages, a first carriage placed closest to the test port, a second carriage and a third carriage, all moving along the slabline each holding at least one remotely controlled reflective tuning probe (slug) perpendicularly insertable into the slabline;

and wherein
    the tuning probe(s) controlled by the first carriage cover a frequency range not lower than 3Fo and have shorter length along the slabline than the tuning probes controlled by the second and third carriages, which cover a frequency range not above 2Fo;
and wherein
    the test port is connected to a device under test (DUT), the input port of the bi-directional signal coupler is connected to the test port, the output port of the bi-directional signal coupler is connected to the slabline of which the idle port is connected to the output port of the power amplifier;
and wherein
    the coupled and isolated ports of bi-directional signal coupler are connected to an external harmonic receiver.

2. The bi-directional signal coupler of the harmonic extension module of the hybrid load pull test system of claim 1 being incorporated into the slabline.

3. The reflective tuning probes (slugs) of the harmonic extension module of the hybrid load pull test system of claim 1 having parallelepiped shape with a length along the slabline, a thickness allowing slide fitting into the slot and a bottom shape mirroring a center conductor of the slabline.

4. A system controller for the hybrid load pull test system of claim 1 retrieving forward and reverse travelling wave information at a DUT reference plan from the harmonic receiver and directing the second signal source, in combination with the settings of the tuning probes, to create a desired reflection factor at the DUT reference plan.

5. The synchronized signal sources of the main frame of the hybrid load pull test system of claim 1 being capable of generating a signal at frequencies F between a frequency F=F1 and a frequency F=F2≥F1,
wherein
    the tuning probes controlled by the first carriage cover a contiguous frequency band
    between a frequency F not below F=3F1 and a frequency F above at least F=3F2, and wherein
    the tuning probes controlled by the second and third carriages cover a contiguous
    frequency band between a frequency F below F=F1 and a frequency F not above F=2F2.

6. The hybrid load pull test system of claim 5,
wherein,
    each carriage controls two tuning probes a first tuning probe and a second tuning probe, and wherein,
    the first tuning probe of the first carriage covers a frequency band between F≥3F1 and F≤F4, and
    the second tuning probe of the first carriage covers a frequency band between F>F4 and F≥3F2,
wherein 3F1<F4≤3F2;
and wherein,
    the first tuning probe of the second and third carriage covers a frequency band between F≤F1 and F≥F3, and
    the second tuning probe of the second and third carriage covers a frequency band between F≤F3 and F≥2F2,
wherein F1<F3≤2F2.

* * * * *